US011997815B2

(12) United States Patent
Nayak

(10) Patent No.: US 11,997,815 B2
(45) Date of Patent: May 28, 2024

(54) WEDGE LOCK SUPPORT COLUMNS IN ELECTRONIC CHASSIS

(71) Applicant: Hamilton Sundstrand Corporation, Charlotte, NC (US)

(72) Inventor: Hebri Vijayendra Nayak, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 659 days.

(21) Appl. No.: 17/171,137

(22) Filed: Feb. 9, 2021

(65) Prior Publication Data
US 2021/0315120 A1 Oct. 7, 2021

Related U.S. Application Data

(60) Provisional application No. 63/003,458, filed on Apr. 1, 2020.

(51) Int. Cl.
*H05K 7/14* (2006.01)

(52) U.S. Cl.
CPC ......... *H05K 7/1404* (2013.01); *H05K 7/1424* (2013.01)

(58) Field of Classification Search
CPC ........................... H05K 7/1404; H05K 7/1424
See application file for complete search history.

(56) References Cited

U.S. PATENT DOCUMENTS

| 4,755,906 A | 7/1988 | Belanger, Jr. | |
| 6,169,247 B1 * | 1/2001 | Craft, Jr. | H05K 7/1424 174/15.1 |
| 6,212,075 B1 | 4/2001 | Habing et al. | |
| 6,246,582 B1 * | 6/2001 | Habing | H05K 7/1404 403/409.1 |
| 6,796,372 B2 * | 9/2004 | Bear | F28F 13/00 165/185 |
| 7,450,384 B2 * | 11/2008 | Tavassoli | H05K 7/20636 361/689 |
| 7,483,271 B2 | 1/2009 | Miller et al. | |
| 8,174,282 B2 * | 5/2012 | Fujii | G01R 31/2621 324/762.01 |
| 8,270,172 B2 * | 9/2012 | Sporer | H05K 7/20545 29/829 |
| 8,456,846 B2 * | 6/2013 | Mosier | H05K 7/20545 361/728 |

(Continued)

FOREIGN PATENT DOCUMENTS

| CN | 209949677 U | 1/2020 |
| EP | 2424341 A1 | 2/2012 |

OTHER PUBLICATIONS

Extended European Search Report for EP Application No. 21161859.0 dated Jul. 23, 2021, pp. 1-9.

*Primary Examiner* — Daniel J Rohrhoff
(74) *Attorney, Agent, or Firm* — CANTOR COLBURN LLP

(57) ABSTRACT

An electronic chassis includes a first side, and a second side opposite the first side. The electronic chassis also includes a first set of wedge lock support columns machined on the first side, and a second set of wedge lock support columns machined on the second side. Each wedge lock support column of the first set of wedge lock support columns and the second set of wedge lock support columns is machined as a continuous shape.

17 Claims, 5 Drawing Sheets

(56) References Cited

U.S. PATENT DOCUMENTS

| | | | | |
|---|---|---|---|---|
| 9,655,269 B2* | 5/2017 | Paykarimah | ......... | H05K 7/1418 |
| 10,136,557 B2* | 11/2018 | Kim | ................... | H05K 7/20336 |
| 2011/0058335 A1* | 3/2011 | Sullivan | ............. | H05K 7/20709 |
| | | | | 361/704 |
| 2012/0051014 A1* | 3/2012 | Duffy | ................... | H05K 7/1404 |
| | | | | 361/759 |

\* cited by examiner

WEDGE LOCK SUPPORT COLUMNS IN ELECTRONIC CHASSIS

CROSS-REFERENCE TO RELATED APPLICATIONS

This application claims the benefit of U.S. Provisional Application No. 63/003,458 filed Apr. 1, 2020, the disclosure of which is incorporated herein by reference in its entirety.

BACKGROUND

Exemplary embodiments pertain to the art of electronics packaging and, in particular, to wedge lock support columns in an electronic chassis.

In many applications, a number of electronic components are arranged and interconnected on a printed wiring board (PWB) assembly. A number of such PWB assemblies can then be mounted in an electronic chassis. Wedge locks are used to lock the PWB assemblies in place in the electronic chassis.

BRIEF DESCRIPTION

In one embodiment, an electronic chassis includes a first side, and a second side opposite the first side. The electronic chassis also includes a first set of wedge lock support columns machined on the first side, and a second set of wedge lock support columns machined on the second side. Each wedge lock support column of the first set of wedge lock support columns and the second set of wedge lock support columns is machined as a continuous shape.

Additionally or alternatively, in this or other embodiments, each wedge lock support column of the first set of wedge lock support columns has a corresponding mirror image among the second set of wedge lock support columns.

Additionally or alternatively, in this or other embodiments, each wedge lock support column of the first set of wedge lock support columns is a same distance from a third side of the electronic chassis as the corresponding mirror image on the second side.

Additionally or alternatively, in this or other embodiments, the third side is between the first side and the second side and is perpendicular to the first side and to the second side.

Additionally or alternatively, in this or other embodiments, the continuous shape of each wedge lock support column is a shape of a square wave.

Additionally or alternatively, in this or other embodiments, each wedge lock support column of the first set of wedge lock support columns protrudes from a fillet region on the first side into a volume of the electronic chassis.

Additionally or alternatively, in this or other embodiments, each wedge lock support column of the second set of wedge lock support columns protrudes from a fillet region on the second side into a volume of the electronic chassis.

Additionally or alternatively, in this or other embodiments, a minimum and maximum distance between adjacent wedge lock support columns is defined by a wedge lock to be inserted in the electronic chassis.

Additionally or alternatively, in this or other embodiments, a number of the first set of wedge lock support columns and a number of the second set of wedge lock support columns define a number of printed wiring boards to be inserted in the electronic chassis.

Additionally or alternatively, in this or other embodiments, a thickness of each wedge lock support structure is based on structural requirements.

In another embodiment, a method includes forming a first set of wedge lock support columns machined on a first side of the electronic chassis. The method also includes forming a second set of wedge lock support columns machined on a second side of the electronic chassis. Each wedge lock support column of the first set of wedge lock support columns and the second set of wedge lock support columns is machined as a continuous shape.

Additionally or alternatively, in this or other embodiments, the forming the first set of wedge lock support columns and the forming the second set of wedge lock support columns includes forming a mirror image among the second set of wedge lock support columns for each wedge lock support column of the first set of wedge lock support columns.

Additionally or alternatively, in this or other embodiments, the forming the first set of wedge lock support columns and the forming the second set of wedge lock support columns includes forming each wedge lock support column of the first set of wedge lock support columns at a same distance from a third side of the electronic chassis as the corresponding mirror image on the second side.

Additionally or alternatively, in this or other embodiments, the third side is between the first side and the second side and is perpendicular to the first side and to the second side.

Additionally or alternatively, in this or other embodiments, the forming each wedge lock support column includes forming each continuous shape of each wedge lock support column as a shape of a square wave.

Additionally or alternatively, in this or other embodiments, the forming the first set of wedge lock support columns includes each wedge lock support column of the first set of wedge lock support columns protruding from a fillet region on the first side into a volume of the electronic chassis.

Additionally or alternatively, in this or other embodiments, the forming the second set of wedge lock support columns includes each wedge lock support column of the second set of wedge lock support columns protruding from a fillet region on the first side into a volume of the electronic chassis.

Additionally or alternatively, in this or other embodiments, the forming the first set of wedge lock support columns and the second set of wedge lock support columns includes a minimum and maximum distance between adjacent wedge lock support columns being defined by a wedge lock to be inserted in the electronic chassis.

Additionally or alternatively, in this or other embodiments, the forming the first set of wedge lock support columns and the second set of wedge lock support columns includes a number of the wedge lock support columns on the first side and the second side defining a number of printed wiring boards to be inserted in the electronic chassis.

Additionally or alternatively, in this or other embodiments, the forming the first set of wedge lock support columns and the second set of wedge lock support columns includes a thickness of each wedge lock support structure being based on structural requirements.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

As previously noted, a wedge lock is used to lock a PWB assembly into place in an electronic chassis. According to one configuration, a PWB assembly has two wedge locks on opposite sides of the PWB assembly. When the PWB assembly is placed in the electronic chassis, the wedge lock on each side slides between columns (i.e., wedge lock support columns) that are machined at the sides of the electronic chassis. The prior machined columns of the electronic chassis exhibit both structural and manufacturability issues. For example, cutout portions within the machined columns, which are used to reduce the weight of the chassis, present challenges for the milling machine. They also represent areas of reduced structural strength. In addition, the machined columns are not designed in consideration of a specific wedge lock.

Embodiments of the systems and methods detailed herein relate to wedge lock support columns in an electronic chassis. As previously noted, a wedge lock on each side of a PWB assembly slides between machined wedge lock support columns of the electronic chassis. A screw through the wedge lock and along the length of the wedge lock is turned after the wedge lock is in place between two wedge lock support columns. The torque applied to the screw, which is referred to as an installation torque, generates an axial load in the screw that is referred to as an installation load. The wedge lock is made up of wedge shapes that move independently of each other, and the axial load in the screw generates a normal load on the wedges. The normal load applied on the wedges of the wedge lock results in a compressive force applied by the wedges to keep the PWB assembly together. The normal load applied on the wedges of the wedge lock also results in normal forces applied by the wedges on the machined wedge lock support columns on either side of the wedge lock. This normal force generates stress in the fillet region, which is the region representing the intersection between the electronic chassis wall and the protrusion of the machined wedge lock support columns. Thus, the structural integrity of the machined columns must be sufficient to withstand these forces. According to one or more embodiments, the shape and dimensions of the wedge lock support columns take into account the wedges that make up the wedge lock. The shape and dimensions of the wedge lock supports also facilitate manufacturability and structural soundness while minimizing weight.

Figure 1:
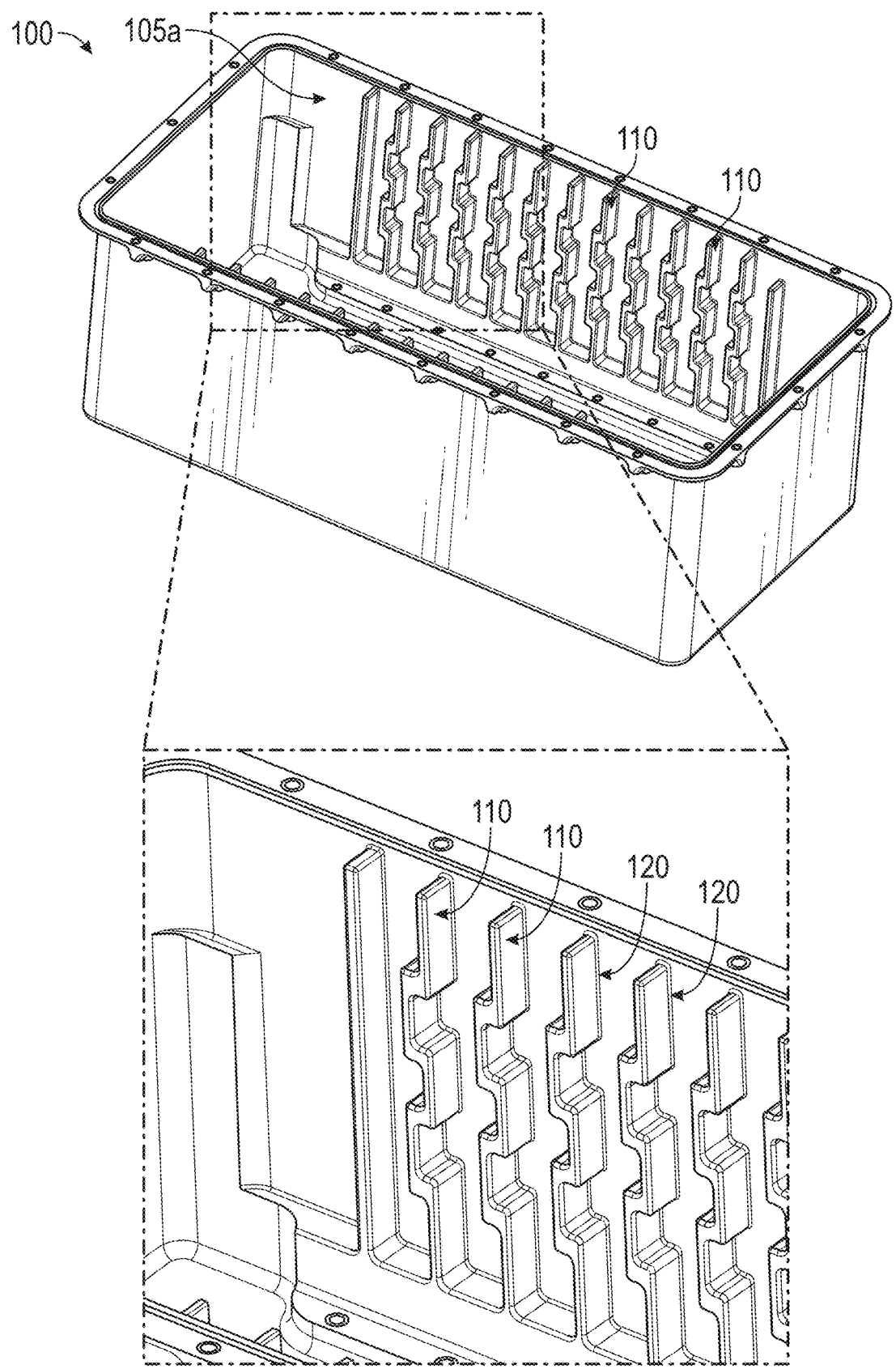
FIG. 1 is an isometric view of an exemplary electronic chassis with wedge lock support columns according to one or more embodiments.
Figure 2:
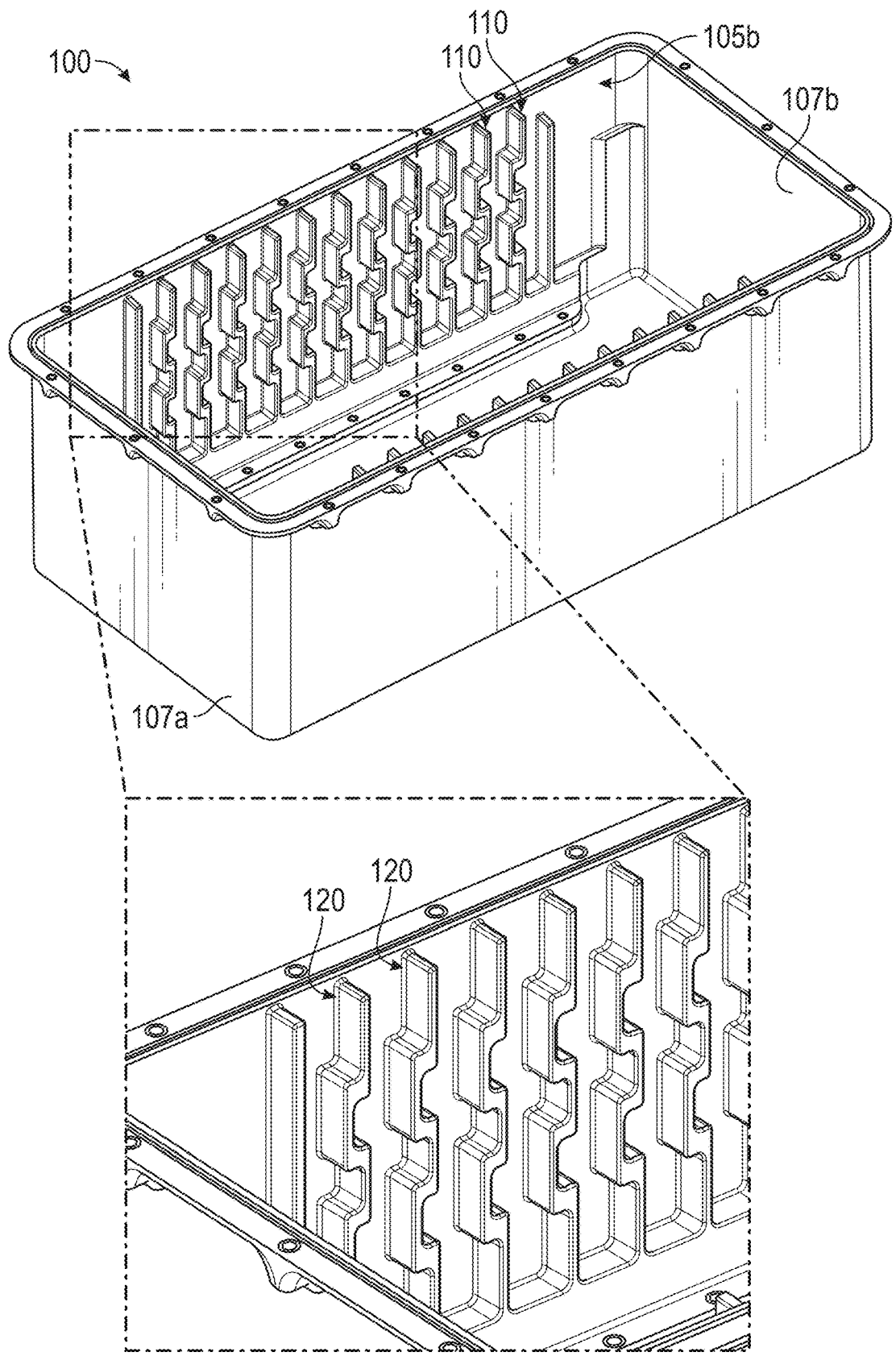
FIG. 2 is a different isometric view of the exemplary electronic chassis of FIG. 1.

FIGS. 1 and 2 are isometric views of an exemplary electronic chassis 100 with wedge lock support columns 110 according to one or more embodiments. FIG. 1 shows the wedge lock support columns 110 on one side 105a of the electronic chassis 100 and also provides an expanded view of the wedge lock support columns 110. The fillet region 120, where the wedge lock support columns 110 intersect with the side 105a, is indicated in the expanded view. Each wedge lock support column 110 is machined as a continuous shape of a given thickness. That is, machining each wedge lock support column 110 does not require a milling machine to cut out portions from a solid shape (e.g., a rectangular shape with a rectangular portion cut out as in prior machined columns). Instead, each wedge lock support column 110 is a solid shape. The thickness of the solid shape need not be constant over its entire length.

FIG. 2 shows the wedge lock support columns 110 on another side 105b, opposite the side 105a shown in FIG. 1, of the electronic chassis 100. As FIGS. 1 and 2 indicate, the wedge lock support columns 110 protrude into a volume of the electronic chassis 100 from the wall of their respective side 105a, 105b beginning at an intersection region referred to as the fillet region 120. The sides 105a, 105b of the electronic chassis 100 with wedge lock support columns 110 are generally referred to as 105. The ends 107a, 107b are generally referred to as 107. The sides 105 and the ends 107 form four interior walls of the electronic chassis 100. The electronic chassis 100 is generally a cuboid with the top cover not shown to expose the sides 105. All the wedge lock support columns 110 in the electronic chassis 100 have the same shape. The electronic chassis 100 (and, thus, the machined wedge lock support columns 110) may be fabricated from aluminum alloy. For example, 2000, 6000, or 7000 series aluminum alloys may be used.

More particularly, each wedge lock support column 110 on the side 105a shown in FIG. 1 has an aligned counterpart on the side 105b shown in FIG. 2. That is, each wedge lock support column 110 on one side 105a has a mirror image wedge lock support column 110 on the other side 105b. Further, each pair of mirror image wedge lock support columns 110 is the same distance from each end 107 of the electronic chassis 100 (i.e., they are directly across from each other). Accordingly, as shown in FIG. 3, a PWB assembly 300 inserted into the electronic chassis 100 will be perpendicular to both sides 105a, 105b (i.e., the PWB assembly 300 between the sides 105a, 105b will form a 90 degree angle with each side 105).

Figure 3:
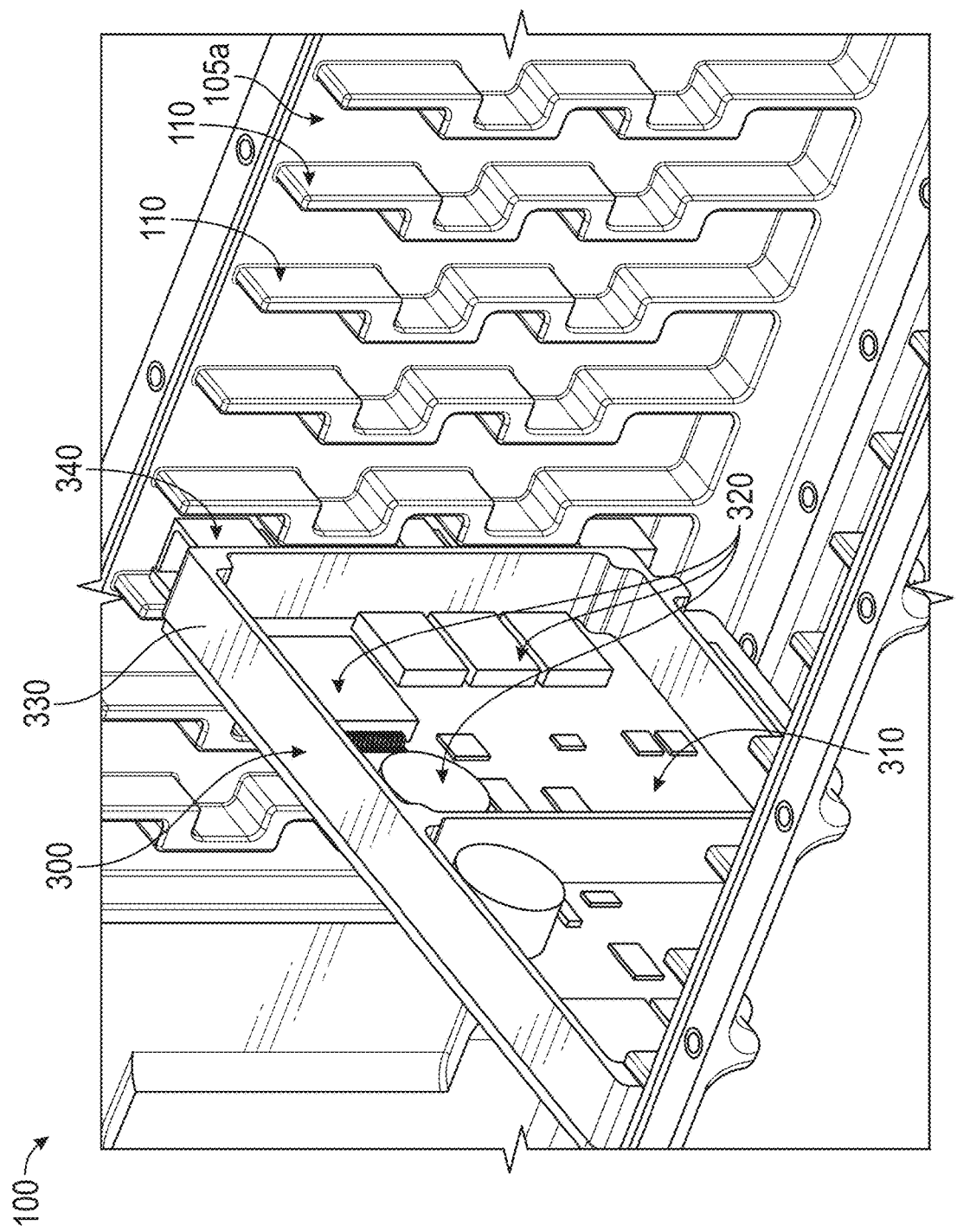
FIG. 3 shows an exemplary printed wiring board (PWB) assembly in an electronic chassis with wedge lock support columns according to one or more embodiments.

FIG. 3 shows an exemplary PWB assembly 300 in an electronic chassis 100 with wedge lock support columns 110 according to one or more embodiments. The PWB assembly 300 includes a PWB 310 and several electronic components 320. A stiffener 330 provides structural support to the PWB assembly 300 and may act as a heat sink, as well. A wedge lock 340 on one side 105a of the PWB assembly 300 is visible in FIG. 3. The wedge lock 340 is between two of the wedge lock support columns 110. A second wedge lock 340 (not shown) on the other side of the PWB assembly 300 is between wedge lock support columns 110 on the other side 105b (FIG. 2) of the electronic chassis 100. Thus, the number of wedge lock support columns 110 on each side defines the number of PWB assemblies 300 that can be inserted into the electronic chassis 100. That is, a PWB assembly 300 cannot be inserted if adjacent wedge lock support columns 110 are not available on each side 105. As further discussed with reference to FIGS. 5-7, the shape and sizing of the wedge lock support columns 110 may be modified based on a particular wedge lock 340.

Figure 4:
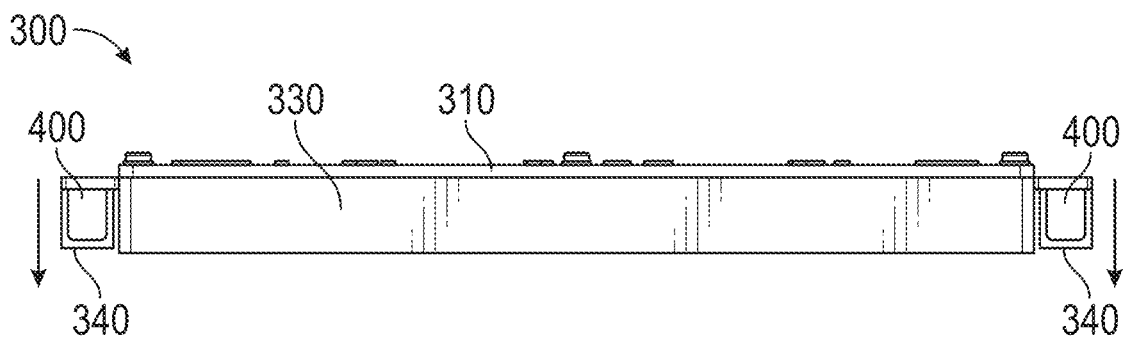
FIG. 4 shows a top-down view of the exemplary PWB assembly shown in FIG. 3.
Figure 5:
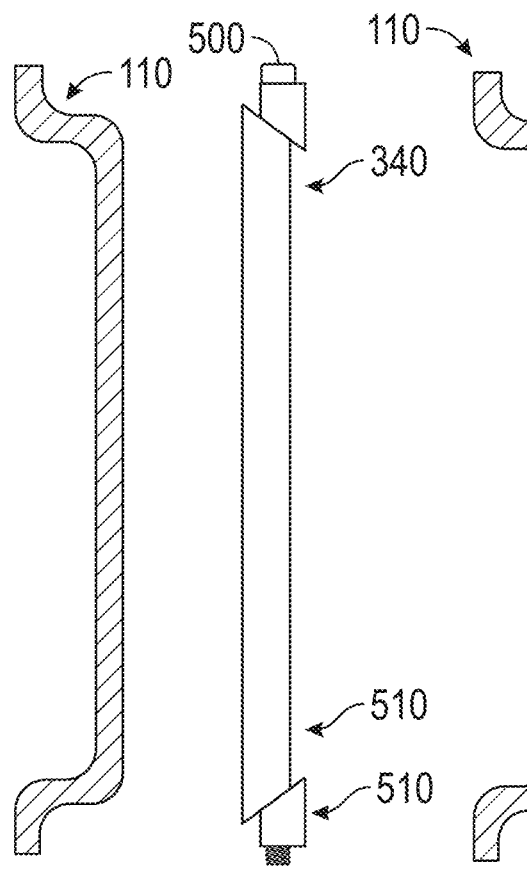
FIG. 5 shows an exemplary wedge lock and a corresponding shape of a wedge lock support column.

FIG. 4 shows a top-down view of the exemplary PWB assembly 300 shown in FIG. 3. The top-down view shows the PWB 310 and stiffener 330. The wedge locks 340 on either side of the PWB assembly 300 are also visible. As the view in FIG. 4 makes clear, a ledge of the stiffener 330 on either side of the PWB assembly 300 is a support on which each of the wedge locks 340 is formed. Each wedge lock 340 has an opening 400 for a screw 500 (FIG. 5). Each of the wedge locks 340 fits between a pair of wedge lock support columns 110, as shown in FIG. 3. As previously noted, each wedge lock 340 is made up of wedges 510 (FIG. 5) that move independently of each other. Arrows shown in FIG. 4 indicate the direction in which some of the wedges 510 move in the exemplary wedge locks 340. This normal movement results from the torque applied to the screw 500.

Figure 6:
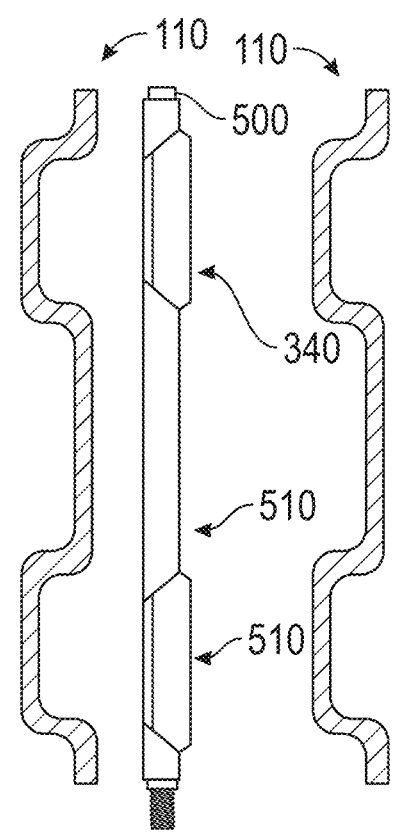
FIG. 6 shows an exemplary wedge lock and a corresponding shape of a wedge lock support column.

FIGS. 5 and 6 show two exemplary wedge locks 340 and corresponding shapes of wedge lock support columns 110. FIG. 5 shows an exemplary wedge lock 340 with three wedges 510. Torque applied to the screw 500 results in an axial load that causes the screw 500 to exert normal forces on the wedges 510. The normal force on the center wedge 510 is in an opposite direction to the normal force on the upper and lower wedges 510 and causes the center wedge 510 to move out of alignment, as shown. FIG. 6 shows an exemplary wedge lock 340 with five wedges 510. In the exemplary wedge lock 340, the normal forces applied by the screw 500 are in the same direction for every other wedge 510. The interaction between the wedges 510 and the wedge lock support columns 110 is further discussed with reference to FIG. 7.

Figure 7:
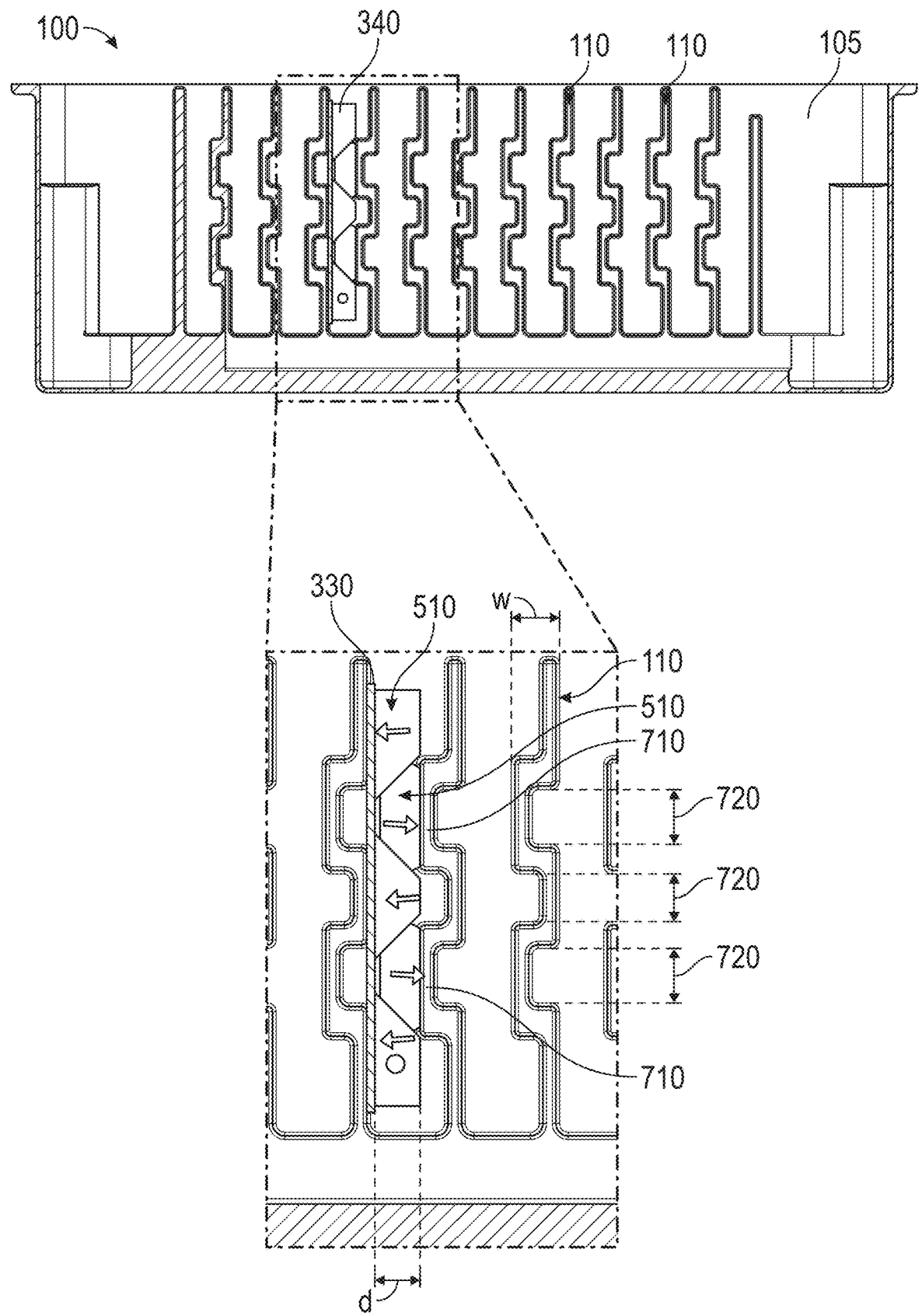
FIG. 7 is a cross-sectional view of a side of an electronic chassis with wedge lock support columns according to one or more embodiments.

FIG. 7 is a cross-sectional view of a side 105 of an electronic chassis 100 with wedge lock support columns 110 according to one or more embodiments. Essentially, most of the electronic chassis 100 and the PWB assembly 100 are cut away to show only the wedge lock 340 on one side of the PWB assembly 100 supported on the ledge of the stiffener 330 between two wedge lock support columns 110. The direction of the normal forces on each of the wedges 510 is indicated with arrows. The wedges 510 that experience a normal force away from the stiffener 330 are pushed into a portion 710 of the adjacent wedge lock support column 110 based on the design of the wedge lock support column 110.

Thus, as FIG. 7 indicates, the distance between adjacent wedge lock support columns 110 must accommodate the depth d of the wedge lock 340 and the thickness of the portion of the stiffener 330 supporting the wedge lock 340 at a minimum. Yet, the distance between adjacent wedge lock support columns 110 must not exceed the full deployed depth of the wedge lock 340 (i.e., the depth after normal forces are applied to the wedges 510, as shown). If adjacent wedge lock support columns 110 are too far apart, then the PWB assembly 110 will not be held in place by compressive forces.

Unsupported sections 720 of the wedge lock support columns 110 are indicated. One the one hand, having these unsupported sections 720 reduces the weight of the electronic chassis 100 in comparison to having wedge lock support columns 110 that are solid across the width w. On the other hand, the unsupported sections 720 must be sized such that the wedge lock support columns 110, the fillet region 120, and the electronic chassis 100 meet structural requirements in vibration and pyroshock environments. The thickness of the wedge lock support columns 110 is also selected in consideration of structural requirements.

As FIGS. 5-7 indicate, the normal forces on adjacent wedges 510 of the wedge lock 340 are in opposite directions. The wedge lock support columns 110 according to one or more embodiments are customized to a particular wedge lock 340. The wedge lock support columns 110 are generally shaped and sized to support the wedges 510 that are pushed away from the stiffener 330 on which the wedge lock 340 is disposed, as well as to support the stiffener 330 and the wedges 510 that are pushed toward the stiffener 330. Yet, as noted previously, the wedge lock support columns 110 cannot be solid columns of the full width w. Thus, the wedge lock support columns 110 generally have a shape like a square wave along a longitudinal direction (i.e., along the vertical axis according to the several views) along a side 105 of the electronic chassis 100. This shape minimizes the effect of the normal forces on the fillet region 120. In addition, the shape enhances the heat transfer that occurs from the PWB assembly 110 to the wedges 510 and the wedge lock support columns 110. Thus, the shape of the wedge lock support columns 110 helps meet both structural and thermal requirements for the PWB assemblies 110 installed in the electronic chassis 100.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electronic chassis for supporting a plurality of printed wiring boards (PWBs), each PWB has opposite sides, each of the opposite sides has a stiffener defining a thickness and a plurality of wedge locks, each of the plurality of wedge locks has a rest depth and a deployed depth when subject to normal forces, the chassis comprising:
   a first side;
   a second side opposite the first side;
   a first set of wedge lock support columns machined on the first side; and
   a second set of wedge lock support columns machined on the second side,
   wherein each wedge lock support column of the first set of wedge lock support columns and the second set of wedge lock support columns is machined as a continuous solid shape;
   wherein:

each wedge lock support column of the first set of wedge lock support columns has a corresponding mirror image among the second set of wedge lock support columns;

adjacent pairs of wedge lock support columns on each side of the chassis are configured to support a PWB and are spaced apart from each other by a distance that accommodates the rest depth and deployed depth of the wedge locks and the thickness of the stiffener supporting the wedge lock; and the continuous solid shape of each wedge lock support column is a square wave, wherein square wave surfaces are arranged so that:

when supporting the PWB between one of the adjacent pairs of wedge lock support columns, the wedge lock support columns apply normal forces in opposite directions against adjacent ones of the wedge locks on each of the opposite sides of the PWB.

2. The electronic chassis according to claim 1, wherein each wedge lock support column of the first set of wedge lock support columns is a same distance from a third side of the electronic chassis as the corresponding mirror image on the second side.

3. The electronic chassis according to claim 2, wherein the third side is between the first side and the second side and is perpendicular to the first side and to the second side.

4. The electronic chassis according to claim 1, wherein each wedge lock support column of the first set of wedge lock support columns protrudes from a fillet region on the first side into a volume of the electronic chassis.

5. The electronic chassis according to claim 1, wherein each wedge lock support column of the second set of wedge lock support columns protrudes from a fillet region on the second side into a volume of the electronic chassis.

6. The electronic chassis according to claim 1, wherein a minimum and maximum distance between adjacent wedge lock support columns is defined by a wedge lock to be inserted in the electronic chassis.

7. The electronic chassis according to claim 6, wherein a number of the first set of wedge lock support columns and a number of the second set of wedge lock support columns define a number of printed wiring boards to be inserted in the electronic chassis.

8. The electronic chassis according to claim 1, wherein a thickness of each wedge lock support structure is based on structural requirements.

9. A system comprising:

the electronic chassis of claim 1; and a PWB having opposite sides, each of the opposite sides has a stiffener defining a thickness and a plurality of wedge locks, each of the plurality of wedge locks has a rest depth and a deployed depth when subject to normal forces, wherein PWB is supported between one of the adjacent pairs of wedge lock support columns, and the wedge lock support columns apply normal forces in opposite directions against adjacent ones of the wedge locks on each of the opposite sides of the PWB.

10. A method of fabricating an electronic chassis for supporting a plurality of printed wiring boards (PWBs), each PWB has opposite sides, each of the opposite sides has a stiffener defining a thickness and a plurality of wedge locks, each of the plurality of wedge locks has a rest depth and a deployed depth when subject to normal forces, the method comprising:

forming a first set of wedge lock support columns machined on a first side of the electronic chassis; and forming a second set of wedge lock support columns machined on a second side of the electronic chassis, wherein each wedge lock support column of the first set of wedge lock support columns and the second set of wedge lock support columns is machined as a continuous shape;

wherein the forming the first set of wedge lock support columns and the forming the second set of wedge lock support columns includes forming a mirror image among the second set of wedge lock support columns for each wedge lock support column of the first set of wedge lock support columns, adjacent pairs of wedge lock support columns on each side of the chassis are configured to support a PWB and are spaced apart from each other by a distance that accommodates the rest depth and deployed depth of the wedge locks and the thickness of the stiffener supporting the wedge lock; and wherein the forming each wedge lock support column includes forming each continuous shape of each wedge lock support column as a square wave, wherein square wave surfaces are arranged so that:

when supporting the PWB between one of the adjacent pairs of wedge lock support columns, the wedge lock support columns apply normal forces in opposite directions against adjacent ones of the wedge locks on each of the opposite sides of the PWB.

11. The method according to claim 10, wherein the forming the first set of wedge lock support columns and the forming the second set of wedge lock support columns includes forming each wedge lock support column of the first set of wedge lock support columns at a same distance from a third side of the electronic chassis as the corresponding mirror image on the second side.

12. The method according to claim 11, wherein the third side is between the first side and the second side and is perpendicular to the first side and to the second side.

13. The method according to claim 10, wherein the forming the first set of wedge lock support columns includes each wedge lock support column of the first set of wedge lock support columns protruding from a fillet region on the first side into a volume of the electronic chassis.

14. The method according to claim 10, wherein the forming the second set of wedge lock support columns includes each wedge lock support column of the second set of wedge lock support columns protruding from a fillet region on the first side into a volume of the electronic chassis.

15. The method according to claim 10, wherein the forming the first set of wedge lock support columns and the second set of wedge lock support columns includes a minimum and maximum distance between adjacent wedge lock support columns being defined by a wedge lock to be inserted in the electronic chassis.

16. The method according to claim 15, wherein the forming the first set of wedge lock support columns and the second set of wedge lock support columns includes a number of the wedge lock support columns on the first side and the second side defining a number of printed wiring boards to be inserted in the electronic chassis.

17. The method according to claim 16, wherein the forming the first set of wedge lock support columns and the second set of wedge lock support columns includes a thickness of each wedge lock support structure being based on structural requirements.

* * * * *